United States Patent [19]

Wrinn et al.

[11] 4,178,543
[45] Dec. 11, 1979

[54] ANALYZING ELECTRICAL CIRCUIT BOARDS

[75] Inventors: Joseph F. Wrinn, North Quincy; Mark S. Hoffman, Newton Center, both of Mass.

[73] Assignee: Teradyne, Inc., Boston, Mass.

[21] Appl. No.: 880,589

[22] Filed: Feb. 23, 1978

[51] Int. Cl.² .............................................. G01R 27/14
[52] U.S. Cl. ........................................ 324/64; 324/421
[58] Field of Search .......... 324/64, 62, 65 CP, 73 PC, 324/72.5, 149, 158 P, 28 CR

[56] References Cited

U.S. PATENT DOCUMENTS

| | | | |
|---|---|---|---|
| 2,659,862 | 11/1953 | Branson | 324/64 |
| 2,854,626 | 9/1958 | Davidson et al. | 324/64 |
| 3,048,776 | 8/1962 | Logan | 324/62 X |
| 3,735,254 | 5/1973 | Severin et al. | 324/158 P X |
| 3,996,514 | 12/1976 | Brown et al. | 324/62 |

FOREIGN PATENT DOCUMENTS

| | | | |
|---|---|---|---|
| 826790 | 11/1969 | Canada | 324/62 |
| 1169711 | 11/1969 | United Kingdom | 324/64 |

Primary Examiner—Stanley T. Krawczewicz

[57] ABSTRACT

Circuit board analysis system, featuring, in various aspects, a probe having three equally spaced tips to simultaneously contact a straight portion of a mounted IC lead, circuitry to monitor contact between the tips and the lead, use of very low level test signals while the board is powered up, and test signal injection to determine the absolute values of internal IC resistance.

25 Claims, 14 Drawing Figures

FIG_4

ANALYZING ELECTRICAL CIRCUIT BOARDS

BACKGROUND OF THE INVENTION

This invention relates to analyzing electrical circuit boards, e.g., to identify an integrated circuit which has failed.

In testing circuit boards it is desirable to be able to identify individual elements which have failed without having to disconnect the elements from the circuit. Circuit faults can be detected by voltage and waveform measurements, but when several elements are connected to a point it is difficult to identify, e.g., which element has short circuited to ground. Current tracing and measurement methods may locate the failed element but generally require successive measurements to be made at various points between elements, which can be difficult when conductive paths between the elements are short.

In a U.S. patent application entitled "Analyzing Electrical Circuit Boards" (Ser. No. 879,881, filed Feb. 21, 1978) recently filed by Richard P. Davis (hereby incorporated by reference), there is disclosed Davis invention of providing a probe having at least two contact tips close enough to each other to simultaneously contact a lead of a mounted integrated circuit, but spaced apart from each other sufficiently to permit measurement of electrical activity in the lead segment between the tips; and measuring the voltage drop between the two tips resulting from the flow of test current through the resistance of the lead segment, which current flow is indicative of the condition of the element. In an embodiment conceived by Davis a third tip was provided to inject a test current directly into the lead, and the voltage drop across the lead segment was made as the current flowed in one direction through the segment. In another embodiment Davis had three tips spaced so that injection could be through either outside tip, and the voltage drop could be measured between the other tips; in that embodiment Davis' tips spanned a total distance of 1/10", and were thus not close enough to reliably fit on the straight portion of a mounted IC lead. But Davis used his probe only to draw qualitative, order of magnitude conclusions about current flows, as any quantitative conclusions would depend on the resistance of the lead segments, which can vary widely from lead to lead.

In another U.S. patent application entitled "Analyzing Electrical Circuit Boards" (Ser. No. 880,056, filed Feb. 22, 1978), recently filed by Alexander Pitegoff (hereby incorporated by reference), there is disclosed Pitegoff's invention of providing a probe with at least two tips spaced generally according to what Davis taught, injecting a test signal directly into the lead via the probe, measuring the voltage drop across a lead segment produced by test current flowing into the IC, also measuring the voltage drop across a lead segment produced by test current flowing away from the IC, and determining the ratio between the internal resistance $R_1$ of the IC on the lead and the parallel resistance $R_2$ of the remaining IC's on the node, which ratio is independent of the resistance of the lead segment.

SUMMARY OF THE INVENTION

Our invention features, in one aspect, providing a probe having at least three equally spaced tips arranged to simultaneously contact the straight portion of a mounted IC lead, injecting a test signal through the tip nearest the IC and measuring the voltage drop between the other two tips due to the current component flowing away from the IC through a first lead segment, injecting a test signal through the tip farthest from the IC and measuring the voltage drop between the tips closest to the IC due to the current component flowing into the IC through a second lead segment equal in length to the first. The ratio $R_1/R_2$ is thus easily and efficiently determined. In preferred embodiments each tip is a single element tip, and the three tips span a total distance of no more than 0.08 inch.

In another aspect our invention features determining the total parallel resistance $R_t$ at the node by injecting a test signal into the lead and making at least one voltage measurement thereon, determining the ratio $R_1/R_2$ by injecting at least one additional test signal into the lead and measuring the voltage drops due to test current components flowing in opposite directions through the lead, whereby the absolute values of $R_1$ and $R_2$ may then be determined. In preferred embodiments, with the circuit board powered up, and using the three tip probe, a four step procedure is carried out with a single placement of the probe: first, using one probe tip, node voltage is measured without injecting a test signal; second, using the same tip, a dc test signal of known current is injected and node voltage is again measured, the voltage difference between the first two steps being the result of the test current flowing through the combined parallel resistance $R_t$ and enabling determination thereof; and third and fourth, injecting ac test signals and measuring the voltage drops across equal length lead segments due to test current components flowing in opposite directions, to determine $R_1/R_2$ as described above. Highly sophisticated diagnosis of circuit board faults is thus made possible.

In another aspect our invention features using injected test signals in the below 10 milliampere range (the range preferably including currents as low as 0.1 ma) to produce measured voltages in the microvolt range and below (the range preferably including voltages as low as 30 nv), all so as not to interfere with normal operation of the powered up board and thus to expose faults not otherwise easily detected. Preferred embodiments of the signal processing circuitry capable of accurately handling such low signal levels feature, for the ac signals, coupling the probe to a synchronous detector through a transformer.

In yet another aspect the invention features monitoring the contact between the probe tips and the lead during the testing by comparing the signal outputs of selected pairs of tips and indicating whether the comparison is as expected. In preferred embodiments a special ac signal, differing substantially in frequency from the ac test signal, is injected in 180° phase shifted versions into two tips, so as to cancel in the probe output if both tips are in good contact with the lead.

Aspects of our invention can also be useful for measurement made on circuit board lands.

DESCRIPTION OF PREFERRED EMBODIMENT

We turn now to the circuitry and operation of a preferred embodiment of the invention, after first briefly describing the drawings.

Probe

Figure 1:
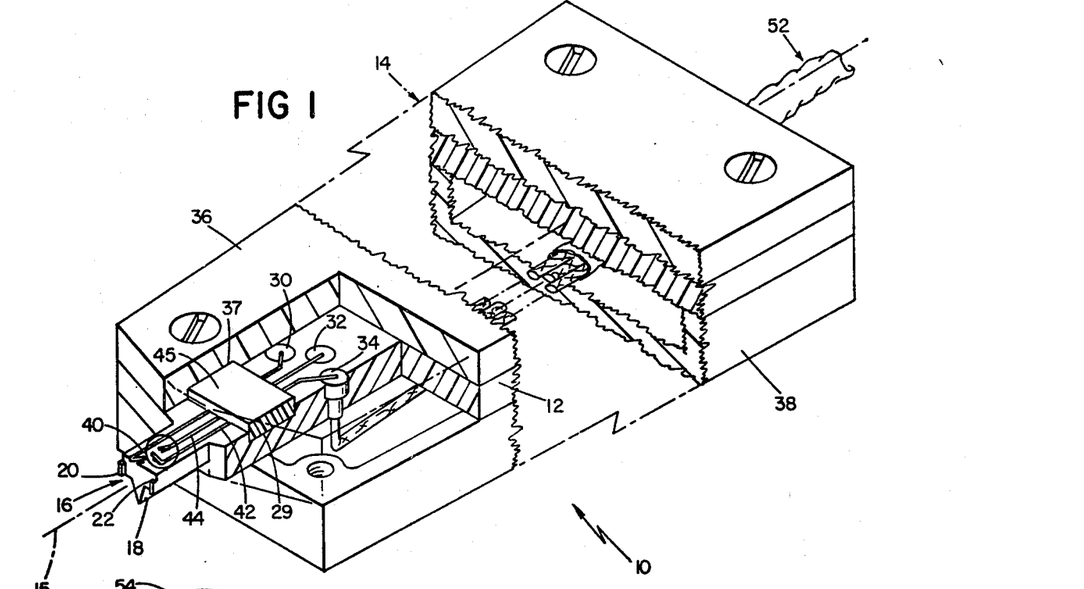
FIG. 1 is an isometric view, broken away, with a portion enlarged, of the probe.
Figures 1A, 2:
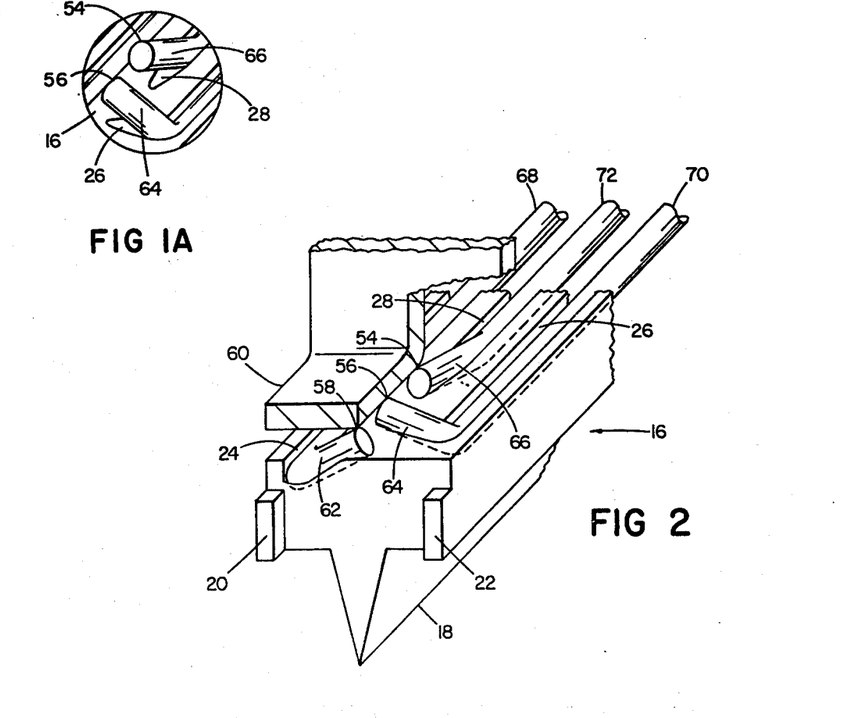
FIG. 1A is an enlarged view of a portion of the probe shown in FIG. 1.
FIG. 2 is an enlarged view, partly in section, of the front end of the probe pressed against an integrated circuit lead part of which is broken away.

Referring to FIGS. 1 and 2, probe 10 has lexan support 12 forming handle 14 and tapering along axis 15 to portion 16 which is 0.13 inch wide and 0.25 inch long. Portion 16 has reinforcing ridge 18 on its back, which may be cut off if necessary (e.g., to fit between adjacent integrated circuits) and standoffs 20 and 22 extending 0.010 inch from its end. Support 12 has L shaped grooves 24 and 26 and straight groove 28 extending from sockets 30, 32, and 34 to portion 16, with groove 24 extending to and across the end of the support. The short leg of groove 26 is spaced 0.030 inch from the short leg of groove 24 and the end of groove 28 is spaced 0.030 from the short leg of groove 26. The grooves are 0.015 inch wide and 0.015 inch deep over most of their length with rounded bottoms, and decrease in depth across the short legs of grooves 24 and 26, and over the last 0.17 inch of groove 28, to zero at their ends. The grooves are interrupted, between the sockets and portion 16, by rectangular recess 29. Lexan retainer 36, which has recess 37 identical to and opposite recess 29, and lexan cover 38, are screwed to support 12. Torsion springs 40 and 42 and beam spring 44 (each of 0.015 inch cupro-nickel wire) are mounted in block 45, which in turn is fitted into recesses 29 and 37, so that the springs lie in grooves 24, 26, and 28. The springs are bent at 90° to fit into sockets 30, 32, and 34, which are standard lead sockets (e.g., A-MP, Inc. No. 331810). Wiring cable 52 (containing cables 102 and 104 and wires 45, 48, and 51 shown more particularly in FIG. 3) is connected to the sockets and the wires pass between support 12 and cover 38 to external circuitry, being anchored in place by conventional strain relief measures (e.g., tie-straps passing through holes in support 12 and around the wires). The springs, as shown in FIG. 2, are longer than the grooves so that ends of the springs cannot be pressed below the surface of portion 16 and contact tips 54, 56, and 58, formed by the circumferential edges of the springs, will in use (as explained below) contact integrated circuit lead 60. The tips are equally spaced 0.030 inch apart and, when the tips are fully depressed by the lead 60 (FIG. 2), are coplanar and in a straight line. Ends 62, 64, and 66 of the springs form 30° angles with the face of portion 16 when not depressed. Ends 62 and 64 are each 0.06 inch long (centerline distance), end 66 is 0.17 inch long. Shafts 68, 70, and 72 generally extend along axis 15. Shafts 68 and 70 are 0.75 inch long, and shaft 72 is 0.64 inch long. Thus, all three springs have conductive paths of equal length and resistance. The overall probe is 5" long.

Circuitry

Figure 3:
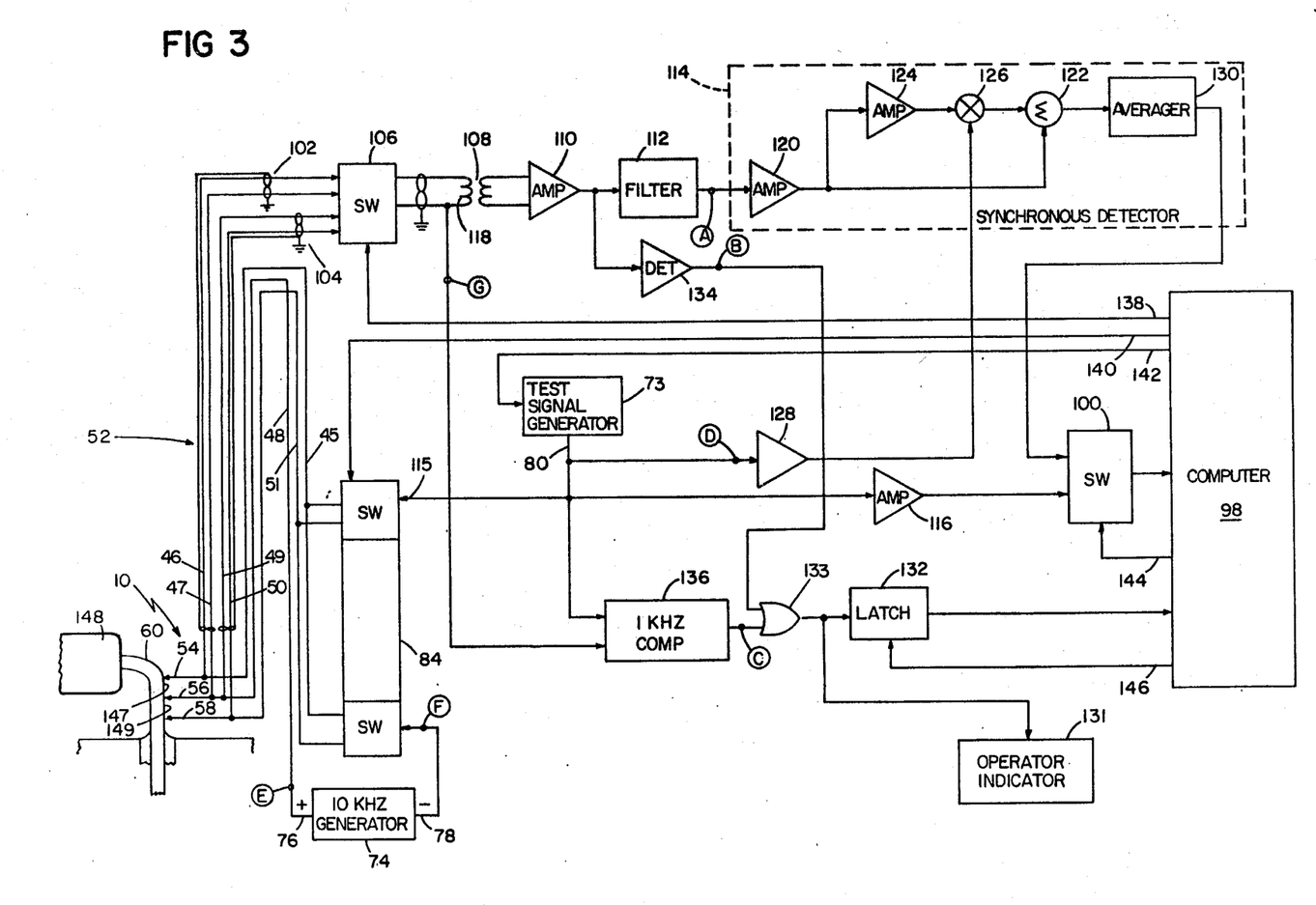
FIG. 3 is a block diagram showing the probe in conjunction with signal processing circuitry.

Referring to FIG. 3, inputs are provided to probe 10 by test signal generator 73 and 10 KHz generator 74, whose + output 76 is connected directly to tip 56 through wire 48 and whose − output 78 is connected, as is output 80 of generator 73, to tip 54 through wire 45 or to tip 58 through wire 51, by DPDT switch 84.

Figure 4:
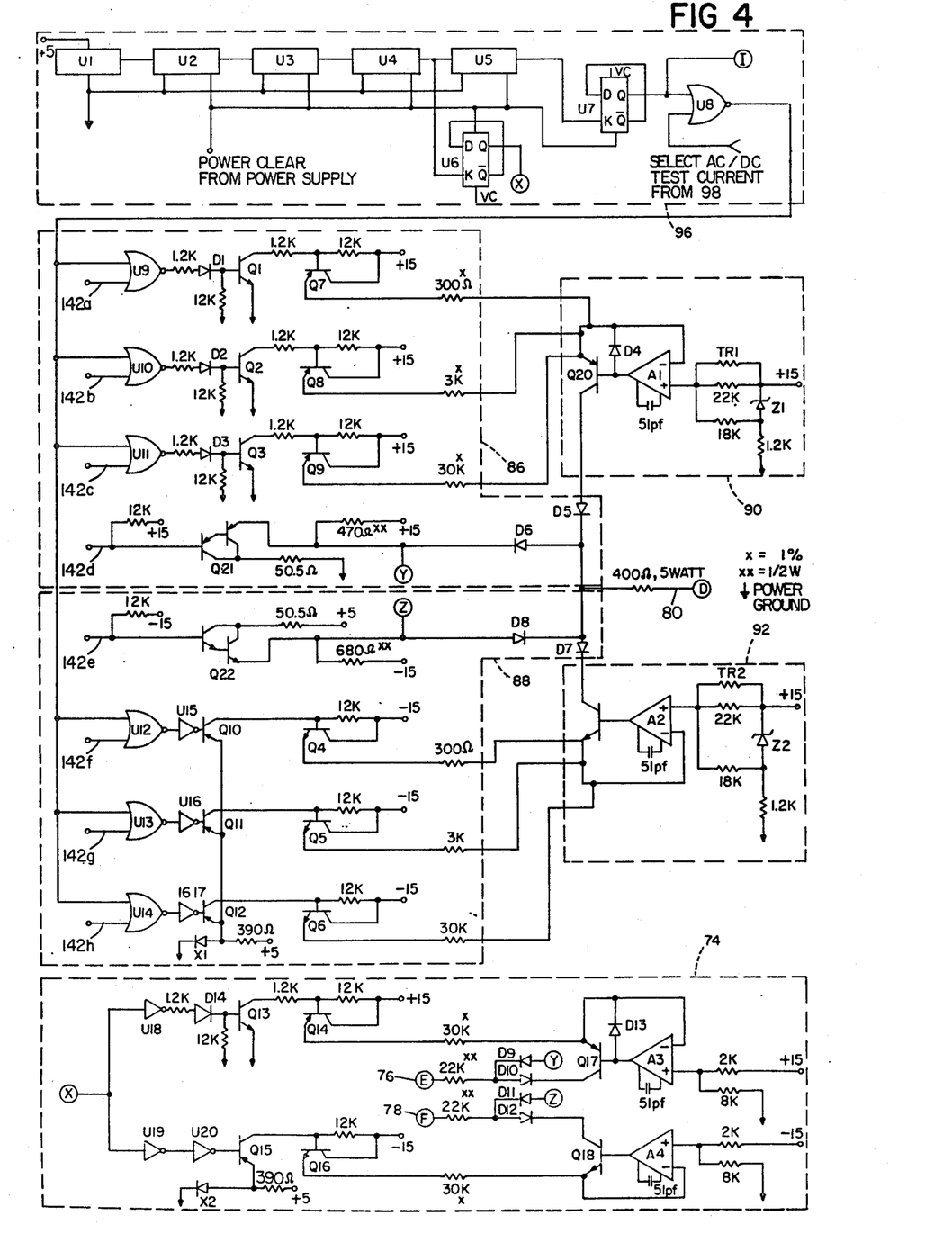
FIGS. 4–6 are schematics of detailed circuitry used in the embodiment of FIG. 3. Conventional electrical symbols are used, and points electrically in common are indicated by letters enclosed in circles.

Generator 73 has selectable, positive and negative, 1 KHz square wave, and dc, current outputs at 0.1, 1.0, and 10 ma. Referring also to FIG. 4, output 80 of generator 73 is provided by positive and negative current gates 86 and 88, which receive inputs from positive and negative current generators 90 and 92, and 1 KHz oscillator 96 and from computer 98 inputs 142.

Test outputs from probe 10 are provided to computer 98 through SPDT switch 100 along one path consisting of cables 102 and 104, DPDT measurement select switch 106, transformer 108, amplifier 110, filter 112, and synchronous detector 114; and along another path comprising input 115 of switch 84 and amplifier 116.

Cables 102 and 104 are twisted, individually shielded pairs with, as shown, tips 54 and 56 connected to switch 94 by, respectively, wires 46 and 47 of cable 102, and tips 56 and 58 by, respectively, wires 49 and 50 of cable 104. Thus wires 47 and 49, which connect tip 56 and switch 106, are carried separately as one of the wires in the twisted pair in each cable. This cable construction reduces cross talk and noise pickup.

Switches 84, 100, and 106 are shielded relays. The coil of switch 106 is connected to ground to reduce coil noise in the relay. Transformer 108 is individually Mu metal shielded, and has a turns ratio of 6:3000; input winding 118 is made of coaxial cable with the outer shield grounded to provide an electrostatic shield. Further shielding is provided by placing elements 106, 108, 110, 112, 134 and 136 together in a Mu metal box, and by filtering the supply voltages to this circuitry.

Amplifier 110 is a high speed impedance matching buffer having an input impedance of greater than 10 Meg ohms and a gainbandwith product of 6 MHz. Filter 112 is a bandpass filter centered on 1 KHz and having a bandwidth of 100 Hz.

Detector 114, which functions as a phase sensitive bandpass filter centered on 1 KHz with a bandpass of 4 Hz, has one signal path from buffer amplifier 120 directly to summing point 122 and another through inverter 124 and chopper 126, which is clocked by the test signal through level shifter 128. The signal then goes through averager 130 to switch 100. Level shifter 128 shifts output 80 from a floating test signal to a ground referenced clock.

Probe placement signals are provided to indicator 131 and, through latch 132, to computer 98 (to confirm that the three contact tips are making electrical contact with the lead) by gate 133, which has inputs from amplifier 110 through 10 KHz detector 134 and 1 KHz comparator 136 which, in turn, receives inputs from winding 118 and generator 73.

Outputs 138, 140, 142, 144, and 146 from computer 98 control the circuitry shown in FIG. 3.

The following table contains the circuit components used in the circuitry shown in FIGS. 4–8, except for resistors and capacitors, whose values are given in FIGS. 4–8. All resistors are 5%, ¼ watt carbon resistors unless otherwise noted. All capacitors are standard, commercial capacitors; those with values between 1.6 nf and 10 nf are film capacitors, those with values between 33 pf and 200 pf are mica capacitors, those with values between 0.01 uf and 0.22 uf are ceramic capacitors, and those with values between 15 uf and 390 uf are tantalum capacitors.

| Component Table | |
|---|---|
| U1 | oscillator, Motorola, Inc. K1114A 10MHz |
| U2–U5 | SN74LS192 |
| U6, U7 | SN74LS74 |
| U8–U14, U22–U24 | SN74LS02 |
| U15–U20 | SN74LS04 |
| U21, U25, U26 | SN74LS38 |
| A1–A10, A12, A14–A18 | operational amplifier, LM201A |
| A11 | operational amplifier, LM311 |
| A13 | operational amplifier, LM218 |
| D1–D5, D7, D9–D24, D27 | Fairchild, Inc. FDH6626 |
| D6, D8, D25, D26 | 1N5060 |
| Z1–Z3 | 6.2v Zener, 1N828A |
| X1, X2 | stabistor, General Electric Corp. STB722 |
| Q1–Q3, Q13, Q18, Q19. | Fairchild, Inc. S39395 |
| Q10–Q12, Q15, Q17, Q20 | Fairchild, Inc. S39394 |
| Q7–Q9, Q14, Q27 | Motorola, Inc. SS557 |
| Q4–Q6, Q16, Q23–Q25 | General Electric Corp. X32D6880 |
| Q21 | 4 ampere Darlington, 2N6036 |
| Q22 | 4 ampere Darlington, 2N6039 |
| Q26 | FET, 2N4416 |
| TR1–TR4 | Selected Resistors, 50K–150K |
| K1–K3 | Relay, General Electric Corp. 3SCV5004D1 |
| T1, T2 | Custom Choke, 350UH |
| Transformer 108 | 6:3000 Transformer; Arnold, Inc. #6T-5651-H1 ferrite tape core; primary made of 6 turns 50 Ωcoaxial cable with shield grounded. |

Figures 9, 11, 12, 13:
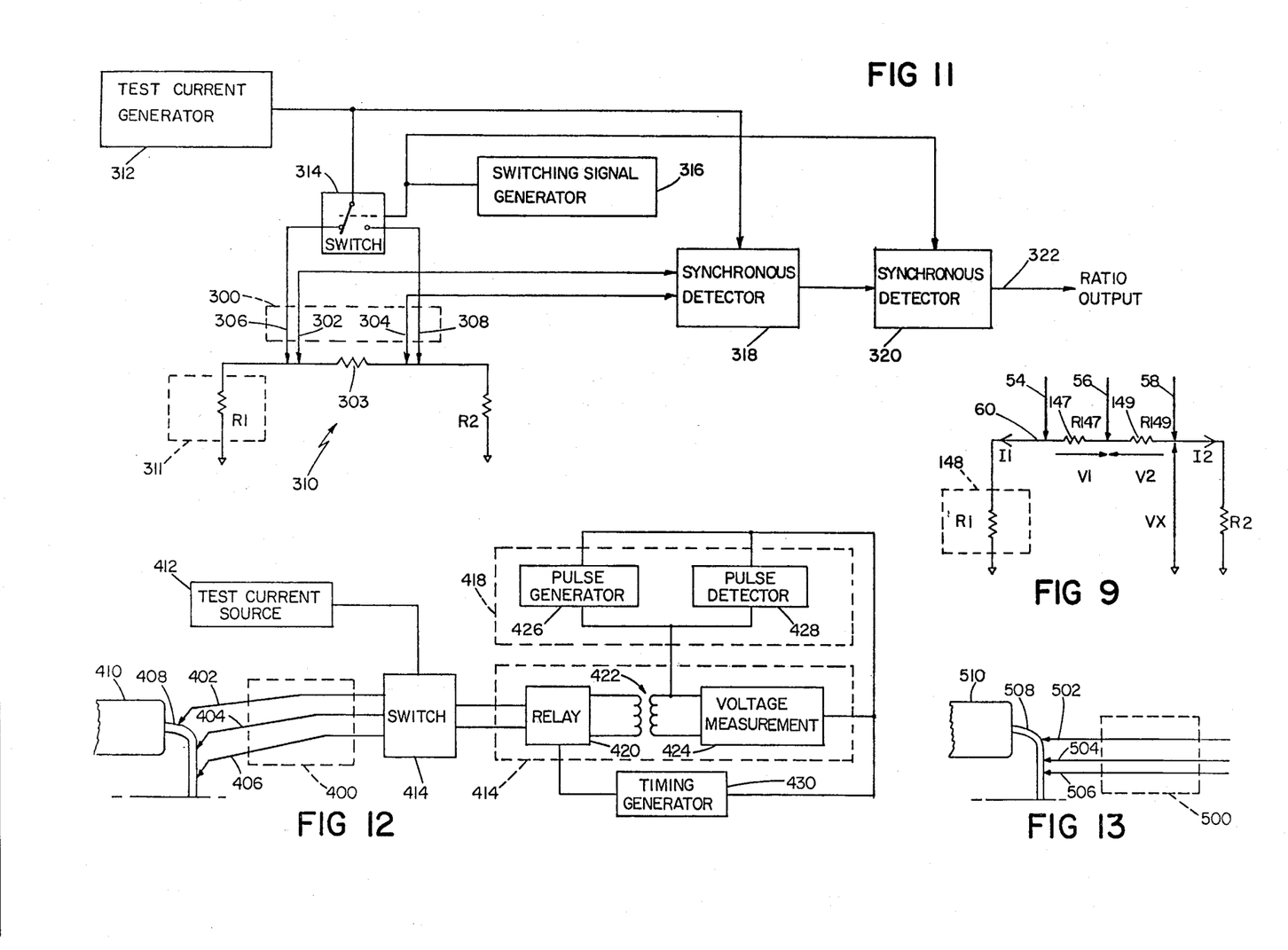
FIG. 9 is a diagrammatic view illustrating how the internal resistance of an integrated circuit may be determined.
FIG. 11 is a block diagram of Pitegoff's original embodiment.
FIG. 12 is a block diagram of Davis' original embodiment.
FIG. 13 is a diagrammatic view of Davis' alternate probe.

In the embodiment of FIG. 11, probe 300 has two measuring tips 302 and 304, each having a Kelvin-related forcing tip 306, 308, making contact with lead 310 of IC 311 on both sides of lead segment resistance 303. Tips 306 and 308 are connected to the output of ac test signal generator 312 through switch 314 which is controlled by the output of switching generator 316. Tips 302 and 304 are connected to the input of synchronous detector 318, which receives a clock input from generator 312, and the output of detector 318 is applied to synchronous detector 320 which receives a clock input from generator 316, to provide dc output 322.

In the embodiment of FIG. 12, probe 400 has three tips 402, 404 and 406, equally spaced 0.050 inch apart. Each tip is a resilient, cantilever spring, bent through a 45° angle, and sharpened to contact lead 408 of IC 410 with their points. The tips are, in the rest position, coplanar with their points lying in a straight line. Test current source 412, which provides a 200 ma dc test current, is selectively connected to tip 402 or 406 through switch 414. Measurement circuitry 416, for measuring the voltage between tips, and monitoring circuitry 418, for monitoring the electrical contacts between the tips and lead 408, are connected through switch 414 to, respectively, tips 404 and 406 or tips 402 and 404. Circuitry 416 includes sampling relay 420, transformer 422, and voltage measuring circuit 424, and circuitry 418 includes pulse generator 426 and pulse detector 428, all of which are controlled by timing generator 430.

FIG. 13 shows an alternate probe with two measuring tips 502 and 504, spaced 0.050 inch apart and a current forcing tip 506 spaced 0.010 inch outboard of tip 504. Each tip in a rigid needle, and the tips are coplanar with their points lying in a straight line. If used in the system of FIG. 12 (eliminating switch 414), this probe will contact the straight portion of the IC lead with all three tips simultaneously.

Operation

Referring to FIGS. 1–3, with normal operating voltages applied to the board being analyzed, probe tips 54, 56, and 58 are placed against lead 60 of integrated circuit 148 to be tested, with standoffs 20 and 22 resting against the board and straddling the meniscus of the solder joint between the lead and the board land. The tips are thus positioned along the straight lead portion between the meniscus and the curve of the lead into the integrated circuit. Probe 10 is then moved toward the lead until the springs bottom out against support 12, bringing the tips into a straight line equally spaced 0.030 inch apart, so the resistances of lead segments 147 and 149 between the tips are equal. In being pressed down, the tips dig into and slide along the lead surface, scraping corrosion from the lead and insuring good electrical contact. The deviation of tip 54 toward tips 56 and 58, as the probe is pressed against the lead, is negligible (particularly as a very slight amount of upward play is provided between shaft 72 and retainer 36, and the shaft thus bends up slightly to accomodate any tendency of tip 54 to move towards the other tips), and tips 56 and 58 rotate in planes parallel to tip 54, thereby maintaining the tips at the desired equal spacing even as the tips wear and increase their contact areas during repeated use. Grooves 24, 26, and 28 positively maintain the lateral position of the tips, contributing to accurate tip spacing.

In the presently preferred embodiment, four testing steps are then carried out under the control of computer 98 acting through control inputs 138–146, without physically moving the probe.

In the first step, the voltage normally appearing at tip 58 is measured, with no test current being injected into the lead, by connecting the input of amplifier 116 to tip 58 through switch 84 and the output of the amplifier to computer 98 through switch 100. The voltage measured is converted into a digital number within the computer by an analog to digital converter (not shown).

In the second step, a dc test current is injected into the lead through tip 58 by generator 73, and, again through amplifier 116, a measurement is made of the resulting voltage appearing at tip 58. Referring to FIG. 4, the polarity (i.e., into or out of tips 58) and magnitude (i.e., 10, 1, or 0.1 ma) of the test current is selected by control inputs 142. The polarity and magnitude of the current are selected, depending upon the type of element being analyzed, the signal normally present on the lead, and the total resistance appearing on the node, to not disturb the normal operation of the circuit. E.g., if 5400 series logic circuits are being tested, the current would typically be 1 ma or 10 ma.

In the third step, the probe outputs from tips 54 and 56 are connected, through switch 106, to winding 118, and the output of detector 114 is connected through switch 100, to computer 98. An ac test current is injected into the lead through tip 58 by generator 73 (again selected (10, 1, or 0.1 ma) not to disturb the operation of the circuit), and the voltage appearing between tips 54 and 56 due to test current flowing into the integrated circuit through the resistance of lead segment 147 is measured.

The ac voltages appearing between the tips in step 3 (as well as in step 4 described below) typically range from 30 nv to 10 μv, and the noise protection features previously discussed, i.e., the shielding of the relays and the circuitry, the twisting and shielding of the cabling, and the construction of transformer 108, together with the circuitry filtering the supply voltages and the grounding of one end of the switch 106 coil, allow these voltages to be accurately measured. Accuracy of the ac measurement is also enhanced by the use of an ac test signal and the specific sequence of transformer 108 as a high gain, low noise amplifier providing commmon mode noise rejection; high speed amplifier 110 to amplify both the test signal and noise, without substantial band limiting, to useful levels without distortion which would confuse the characteristics of each; filter 112 to reduce noise in preparation for synchronous detection; and synchronous detector 114, which effectively eliminates from the measurement signal all components not identical in frequency and phase with the injected test signal. Averager 130 converts the measurement signal into an integrated dc voltage proportional to the 1 KHz component of the measurement signal. The gain-bandwidth product of amplifier 110 is preferably greater than 5 MHz. The bandwidth of filter 112 is selected to be as narrow as possible, preferably no more than 10% of the center frequency, insuring that the 1 KHz test signal falls within the 3 db points of the passband as the passband drifts with age and temperature. The bandwidth of detector 114, which is determined by averager 130, is selected to be as narrow as possible while not requiring an excessive waiting period for the measurement, and is preferably less than 15 Hz.

In the fourth step, the probe outputs from tips 56 and 58 are connected, through switch 106, to winding 118, and tip 54 is connected, through switch 84, to generator 73. The ac test current is injected into the lead through tip 54, and the voltage appearing between tips 56 and 58 due to the test current flowing away from the integrated circuit through the resistance of lead segment 149 is measured.

In each of the four test steps, the placement of probe 10 against the lead is monitored by two independently operating circuits (described below) to insure proper electrical contacts (i.e., with resistances less than 0.10 ohms) between the three tips and the lead.

In the first monitoring circuit, output 76 of 10 KHz generator 74 is connected directly to contact tip 56 while output 78, which is phase shifted 180° with respect to output 76, is connected through switch 84 to tip 54 during steps 1-3 and to tip 58 during step 4. If, during each test step, the two tips connected to generator 74 are both making proper electrical contact with the lead, both outputs will be present in the lead and will cancel each other; if one of the tips is not making proper contact, only one output will be present and, being uncancelled, will pass through the probe output to 10 KHz detector 134, which will trigger latch 132, through ORing gate 133, to generate an alarm output to computer 98. The latch stores the fact of a probe placement error until released by acknowledgment output 146 from the computer. The output of gate 133 is provided directly to indicator 131, located on probe 10, without being stored.

In the second monitoring circuit, one input of comparator 136 is connected, through switch 84, to tip 58 during steps 1-3 and to tip 54 during step 4, while the other input is connected, through switch 106, to tip 56 during steps 1-3 and to tip 58 during step 4. If, during each test step, the tips connected to the comparator inputs are both making proper electrical contact with the lead, the same signal will be present on both inputs (i.e., the signal due to normal operation of the circuit, the test signal, if any, and any uncancelled output from generator 74); if either tip is not making proper contact, the inputs to the comparator will differ and, if they differ by more than 0.10 volts, comparator 136 will trigger the latch through gate 133, again providing an indication at the probe.

During test steps 1-3, therefore, the first monitoring circuit checks tips 54 and 56 and the second circuit checks tips 56 and 58, while, during step 4, the first checks tips 56 and 58 and the second checks tips 54 and 56.

The measurements made in the four test steps yield information, relating to the internal resistance of integrated circuit 148, which, as described below, is useful in diagnosing and locating faults in the circuit board. Because the tests do not disturb the normal operation of the board, faults which are best detected (and in some cases can only be detected) under normal operation conditions (i.e., with normal operating power applied to the board) can be identified: e.g., resistors and capacitors whose values change, capacitors which leak, relays and switches which have excessive contact resistance under normal operating voltages, transistors or integrated circuits having insufficient gain or excessive leakage currents, and failed transistors, internal to an integrated circuit, which cause the input or output transistors of the integrated circuit to appear to be open or short circuited.

FIG. 9 illustrates one general approach to determining the internal resistance of integrated circuit 148. Resistance R1 represents that internal resistance while R2 represents the combined, parallel internal resistances of all other ICs connected to the same node (i.e., a point within a circuit common to two or more IC inputs and outputs) as lead 60. When test current I is injected into lead 60 through contact tip 58, component I1 will flow into R1 and component I2 into R2, causing voltage Vx to appear at tip 58, where $Vx \approx I1 \times R1 \approx I2 \times R2$, and R1 can be determined if Vx and I1 are known. Where a voltage is normally present on lead 60, e.g., the normal operating voltage of the circuit, Vx is found by first measuring the voltage at tip 58 without injecting the test current and then measuring the voltage while injecting the test current, i.e., the first and second test described above; Vx is the difference between the two measurements (i.e., the voltage due to the injected test current). I1 is determined from the equation $I1 = V1/R147$ where V1 is the voltage appearing between tips 54 and 56 due to I1 flowing into R1 through R147, the resistance of lead segment 147. V1 is determined from the change in the voltage between tips 54 and 56 due to the injection of the test current, as in the first and second test steps, or by injecting an ac current at a known frequency (e.g., as in step 3) and detecting the voltage appearing between tips 54 and 56 at that frequency. If R147 is known V1 may be calculated.

However, by using information from all four test steps, one can avoid having to know the resistances of lead segments 147 and 149 (which may vary over a range of ten to one, depending upon the lead material). The total resistance appearing at probe 10 (i.e., the parallel combination of R1 and R2) is determined from the information gained in the first and second test steps by solving the equation $Rt = Vx/I$; where I is the test current (i.e., $I = I1 + I2$); Vx is, again, the difference between the voltages appearing at tip 58 due to the injection of the test current, and $Rt = (R1 \times R2)/(R1 + R2)$. Because R147 and R149 are equal, due to the geometry of contact tips 54, 56, and 58, the equations $V1 = I1 \times R147$ and $V2 = I2 \times R149$ may be solved to give $I1/I2 = V1/V2$. V1 is determined during the third test step by measuring the voltage appearing between tips 54 and 56 due to I1 with the test current injected through tip 58, and V2 is determined during the fourth test step by measuring the voltage appearing between tips 56 and 58 due to I2, with the test current injected through tip 54. Applying the law of current division through parallel resistances (i.e., I dividing to become I1 through R1 and I2 through R2), I1 and I2 are expressed as $I1 \simeq (I)(R2)/Rt$ and $I2 \simeq (I)(R1)/Rt$, which gives the relationship $I1/I2 = R2/R1$, and, applying the relationship $V1/V2 = I1/I2$, $R2/R1 = V1/V2$. Therefore, by finding V1, V2, and Vx, and knowing I, the equations $R1/R2 = V2/V1$ and $Rt = (R1 \times R2)/(R1 + R2)$ may be solved to find R1 and R2 without requiring that the resistances of lead segments 147 and 149 be known.

Figure 10:
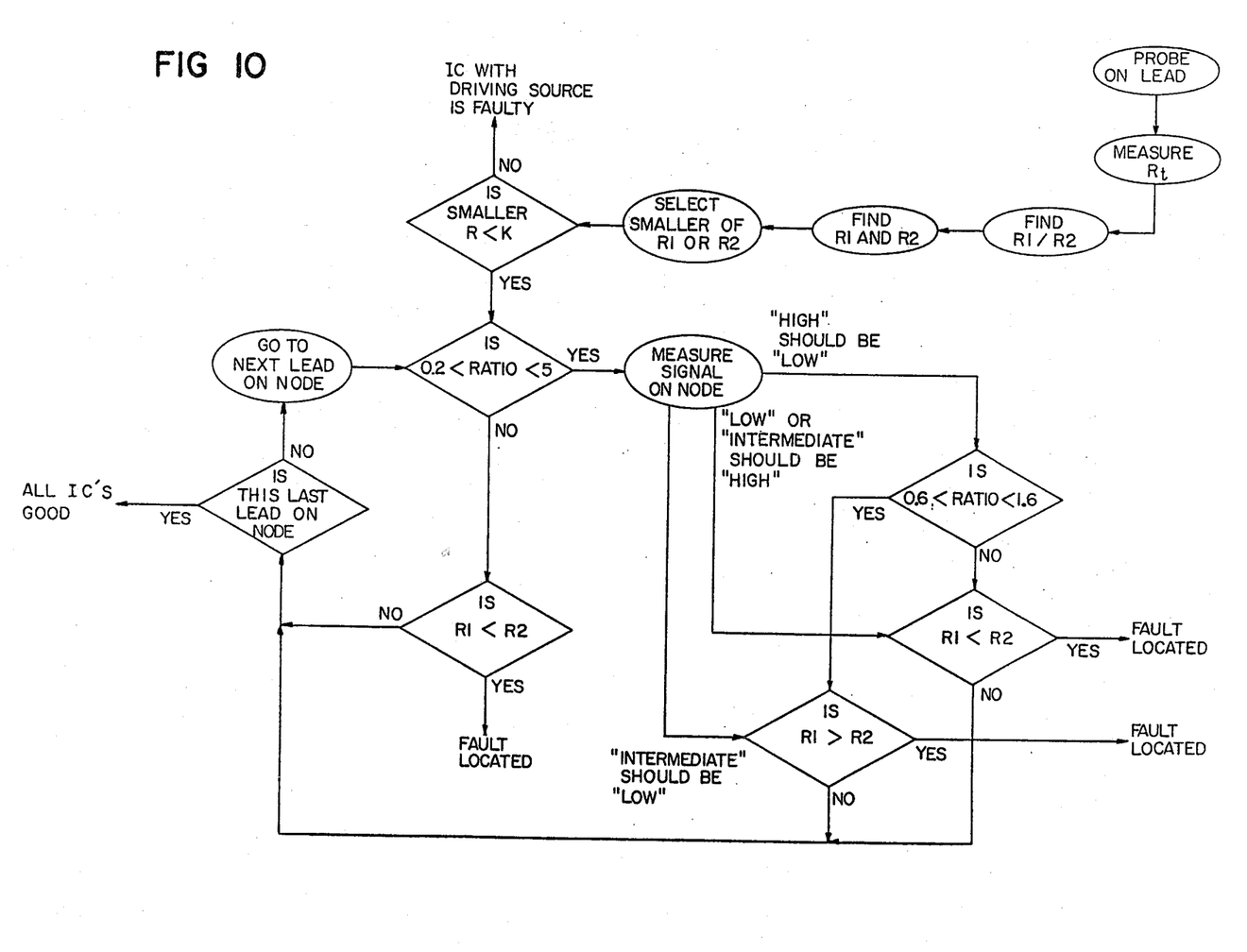
FIG. 10 is a flow diagram illustrating the operation of a preferred circuit analysis system including the embodiment of FIG. 3.

In the most preferred approach, illustrated in FIG. 10, the value of the total parallel resistance present at the probe (Rt), the ratio between the internal resistance of the integrated circuit (R1) and the total parallel resistances of all other ICs connected to the anode (R2), and the values of R1 and R2, are used to locate faults in the board.

If a circuit node is suspected of having a failed integrated circuit connected to it, the operator places probe 10 on the lead of the IC selected as most probably being failed, usually the lead connected to the IC circuit driving (i.e., providing a signal to) the node, if that output is known, and normal operating voltages are applied to the circuit board.

The first stage in the circuit analysis determines whether there is at least one effective, active driving circuit connected to the node. The majority of circuit nodes have one or more driving circuits connected to them and one or more load, or input, circuits. The internal resistance Rd of a driving circuit is typically much less than that of an input circuit (e.g., for TTL or ECL logic circuits a driving resistance is 130 ohms while a load resistance is 1.3 K ohms), so that driving and input circuits can be distinguished through their internal resistances.

In the first stage, computer 98 directs the circuitry of FIG. 3 in carrying out all four test steps described earlier to determine the total parallel resistance (Rt) appearing at the lead and the ratio between R1 and R2 and, from these, solves for R1 and R2. The computer then selects the smaller of R1 or R2 and compares that value to a number K which is selected to be equal to or slightly greater (to allow for tolerance in the resistance) than the driving resistance (e.g., K=200 ohms for TTL or ECL logic). Since R2 is the total parallel resistance of all other ICs connected to the node, it may or may not include an active driving circuit; e.g., if R2 consists of N or more load resistances, where N is equal to the ratio between a load and a driving resistance (e.g., N=10 for TTL and ECL logic), then R2 may be less than K. This case is not considered, however, as good design practice requires that no driving circuit be loaded with such an extreme number of input loads.

If neither R1 nor R2 is less than K, the fault most probably lies with the IC containing the driving circuit for the node, i.e., there is no active driving circuit present on the node. The computer indicates that this is the fault and the IC containing the driving circuit must then be located, e.g., by referring to circuit diagrams. If an active driving circuit is found (i.e., either R1 or R2 is less than K), the fault is most probably not a failure of the driving circuit (e.g., an open circuit) but is a failure in an input circuit, and it is necessary to apply more sophisticated criteria to determine the probable location of the fault, by proceeding to the second analysis stage.

The second stage of the analysis determines whether the fault is a shorting resistance between an IC input circuit and the internal supply voltage of the IC (e.g., in TTL and ECL logic circuits, a shorting resistance to the internal 1.2 volt threshold voltage of the ICs holding the voltage appearing on the node below 1.8 volts, the logic 0 to logic 1 threshold voltage) by determining whether the ratio R1/R2 is outside a range bounded by the ratio of Rs (as defined below) to Rd, and the reciprocal Rd/Rs. For TTL and ECL logic, the preferred bounds are 0.2 and 5.0. Rs is selected by determining, for each possible configuration of shorting resistance, the maximum value that this resistance could assume and still effectively cause the fault symptom to appear. In general, a ±20% range around each bound for the range will give useful results.

It was determined in the first stage that there is an active driving circuit present on the node, so that, e.g., for TTL and ECL logic, the maximum value of shorting resistance is less than 1/5 of the driving resistance (1/5 of 130 ohms, or 26 ohms) if the node voltage is being held below 1.8 volts. If the fault is located at R1, the driving resistance will be part of R2 and R2 will be equal to or less than the driving resistance (e.g., 130 ohms) so that the ratio R1/R2 (26/130) will be less than 0.2. If the fault is located within R2, R2 will be equal to or less than the value of the shorting resistance (26 ohms) and R1 will be greater than or equal to a driving resistance (130 ohms), so that the ratio R1/R2 (130/26) will be greater than 5.0.

Rs is preferably determined by applying conventional circuit analysis techniques, i.e., determining the actual input and driving circuits in the type of ICs of interest (e.g., by reference to a manufacturer's product catalog); assuming a circuit having one driving circuit driving the maximum allowable number of input circuits; assuming a shorting resistor of unknown value connected between the input and the internal supply voltage in one driving IC; applying Thevenin's and Norton's equivalent circuit analysis to obtain a set of equations relating Rs to the characteristics of the assumed fault; and solving the equations to find Rs.

In the shortened, approximation approach typically applied in the engineering field, such an analysis would appear as follows:

Referring, e.g., to the circuit of an SN5400 two input NAND gate shown on pages 3–6 of the Texas Instruments, Inc. TTL *Data Book for Design Engineers, Second Edition*, it is assumed that the multi-emitter input transistor has failed so that there appears to be a shorting resistor (Rs) connected between, e.g., input A, and the collector of that transistor. Because this collector is held at two diode forward voltage drops above ground (through the base-emitter diodes of the transistor whose base is connected to the collector of the input transistor, and the transistor whose base is connected to the emitter of that second transistor), this shorting resistor appears to be connected between input A and a 1.2 volt internal supply voltage. The output of the gate appears as a 130 ohm resistor (Rd) and a diode in series connected to the 5 volt external supply voltage to the gate when the gate output is trying to raise the node voltage to a logic "1" (i.e., 1.8 volts). The equivalent circuit thus appears as a series connection of a 130 ohm resistor and an unknown shorting resistor (Rs), connected between a 4.4 volt level (5.0 volts minus a 0.6 volt diode drop) and a 1.2 volt level. The voltage Vn at the junction between the resistors (i.e., the node) is thus given by the equations below, where Rs is the value of the shorting resistance, $$Vn = 1.2v + \frac{Rs}{(130\ \Omega + Rs)} \times (4.4v - 1.2v)$$

The equation is solved to find Rs for a Vn of 1.8 volts, and Rs is found to be 26 Ω, or 0.2 times the 130 Ω driving resistance Rd.

If, therefore, the computer finds that the ratio R1/R2 is less than 0.2 or greater than 5.0, the fault is most probably located in the smaller of R1 and R2, which smaller value contains the shorting resistance (e.g., 26 ohms). Thus, if R1 is smaller than R2, the computer indicates that the fault has been located. But if R2 is greater than R1, the operator goes to the next lead on the node (unless he is already at the last lead, in which event the computer indicates that all ICs are good), and repeats stage two.

If the ratio R1/R2 lies within the limits 0.2 to 5.0, all of the internal resistances (R1) on the node are large enough, compared to the driving resistance, that the fault is most probably not an internal shorting resistance between the IC input and the internal supply voltage and further criteria must be applied.

The criteria used in the third stage of the analysis are based upon the difference between the voltage actually present on the node and a known voltage expected to be present if there were no fault. If the voltage present is some intermediate level (e.g., between a logic "0" and a logic "1") and should be low (e.g., a logic "0"), i.e., the driving circuit is attempting to pull the node voltage down to logic "0" but cannot, then the fault most probably appears as a shorting resistance higher than the driving resistance between an IC input and the supply voltage to the IC (e.g., +5 volts for TTL logic). If R1 is this shorting resistance, R1 will be greater than R2, which contains the driving resistance, and the computer will so find and indicate the fault has been located. If R1 is not greater than R2, the operator goes to the next lead on the node and the test procedure begins again with the second stage, except that the computer will indicate that all IC's on the node are good if the probe is on the last lead to be tested.

If the voltage present is at a low or intermediate level (e.g., at logic "0" or between logic "0" and a logic "1") and should be high (e.g., at a logic "1"), i.e., the driving circuit cannot pull the node voltage up to a logic "1", then the fault appears as a low valued shorting resistance (compared to a driving resistance) between an IC input and ground. Thus, if R1 is less than R2, which again contains the driving resistance, the computer will so find and indicate the fault has been located. If R1 is not less than R2, the operator goes to the next lead and the test begins again with the second stage, except that the computer will indicate that all IC's in the node are good if the probe is on the last lead to be tested.

If, however, the voltage present on the node is high and should be low (e.g., a logic "1" and should be a logic "0"), the fault is not a high resistance short to the IC supply voltage or a low resistance short to ground, but some intermediate value of resistance and it is necessary to apply an R1/R2 ratio criterion, as was applied in the second stage of the analysis. The criterion was determined in the same manner as in the second stage; assuming some configuration of shorting resistance, determining the range of allowable values of resistance for each configuration that would cause this fault to appear and, from this, determining the corresponding ranges for the ratio R1/R2. I.e., the shorting resistance can be part of either R1 or R2, and the other of R1 or R2 will be equal to or less than the driving resistance, as discussed in the second stage, so that the shorting resistance is limited to be less than 60% of the driving resistance, i.e., the ratio R1/R2 will be between 0.6 and 1.6. If the ratio lies in the range of 0.6 to 1.6, the fault is most probably a shorting resistance larger than a driving resistance and, if the ratio lies outside the range 0.6 to 1.6, the fault is most probably a shorting resistance smaller than a driving resistance. The computer respectively determines whether R1 is greater or less than R2 and, if this test is positive, indicates the fault located. If the test is negative, then, as described above, the operator either goes to the next lead or the computer indicates that all IC's on the node are good.

Figure 5:
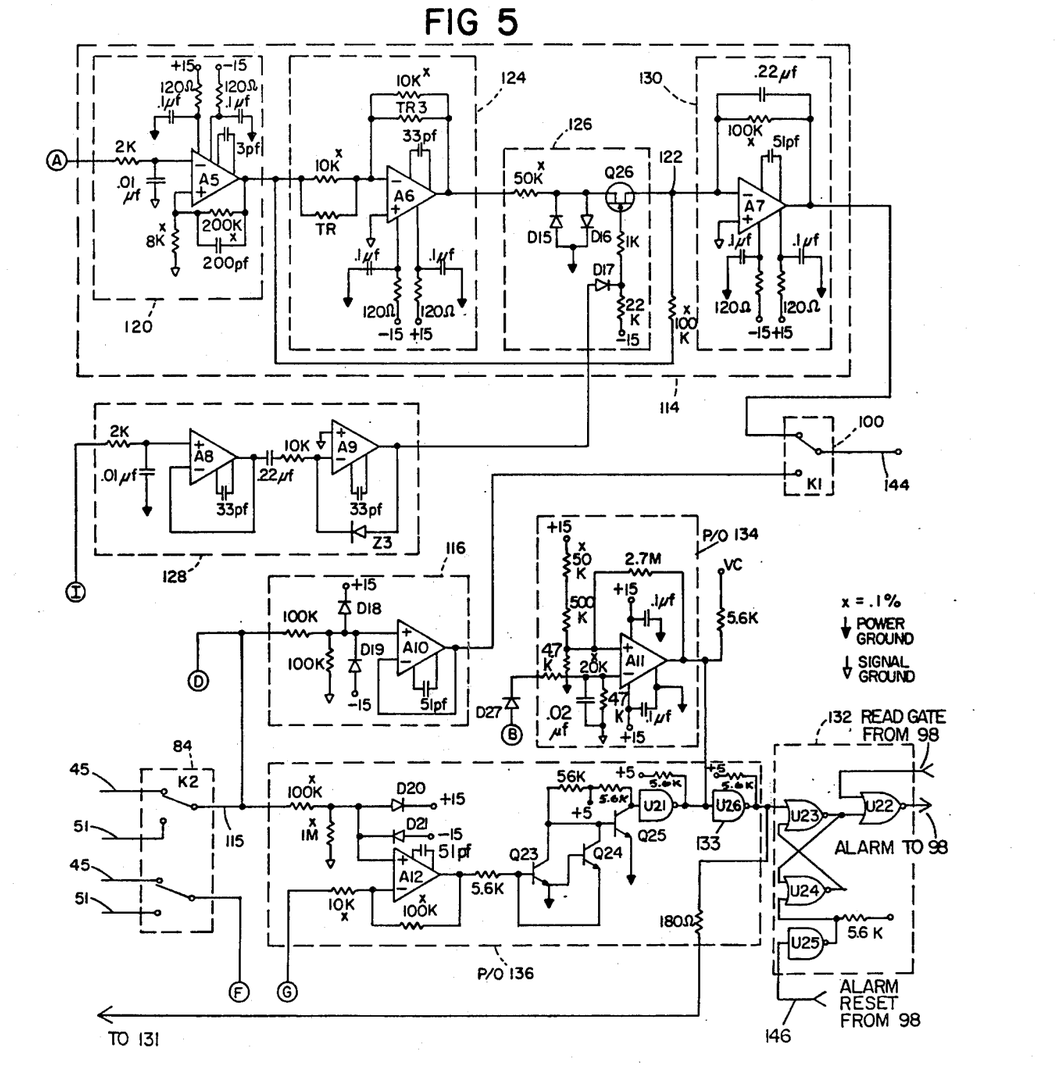
Figure 6:
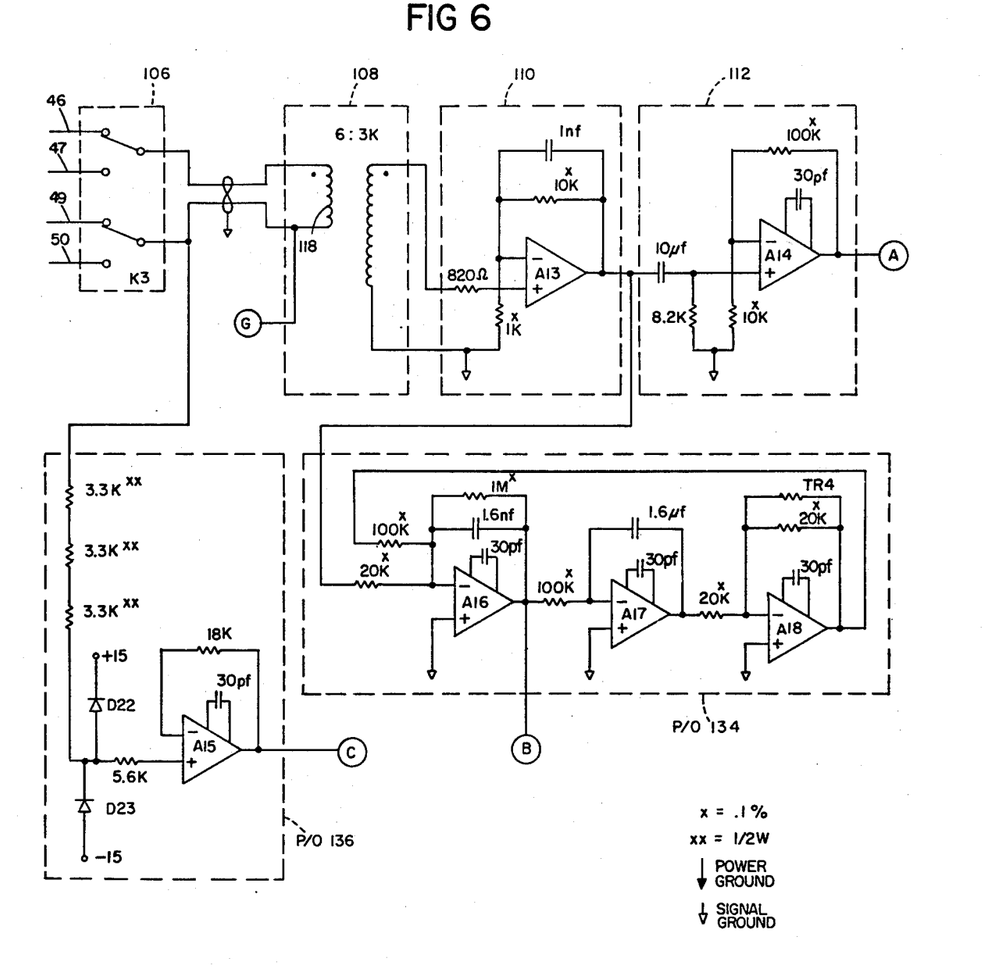
Figure 7:
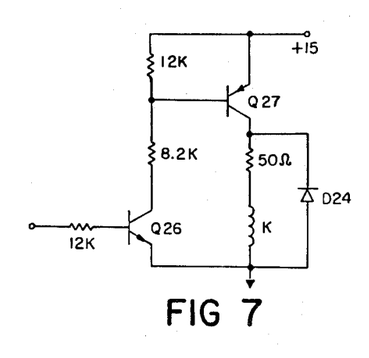
FIG. 7 is a schematic of the circuit used to drive the relays of FIGS. 3–6.
Figure 8:
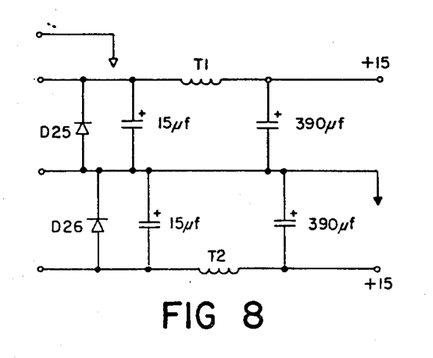
FIG. 8 is a schematic of the power supply filter circuitry.

Conventional programming techniques can be used to adapt the flow chart of FIG. 10 to an available computer. The preferred embodiment, using the Teradyne M365C computer, incorporates circuit path tracing and other features found in the Teradyne L125 Circuit Diagnostic System, for locating a faulty node prior to practice of the present invention. In Appendix A of said Davis application there is provided a line printout of a program suitable for implementing the preferred embodiment on an L125 system modified to incorporate the special probe and circuitry described above. In Appendix B of said Davis application is Teradyne's manual containing detailed instructions for so modifying an L125. The contents of Appendices A and B are incorporated herein by reference. The schematics for circuit boards CT133, CT134, and CT136 in Appendix B are shown in FIGS. 4–6 of this application. The remainder of the circuit boards referred to in Appendix B are the same as identically designated boards presently used in the L125, and need only be duplicated to be used in interfacing the circuitry of FIGS. 4–6 with the L125.

In the embodiment of FIG. 11, ac test current at frequency f1 from test signal generator 312 is injected into lead 310 through switch 314 and tips 306 and 308 alternately. The alternation between the forcing tips is at a rate f2, less than f1 and controlled by the output of switching generator 316. Voltages mutually phase shifted by 180° thus appear alternately between tips 302 and 304 due to the components of test current flowing alternately from tip 308 into resistance R1 of IC 311 and from tip 306 away from R1 and into R2, the combined parallel resistance of the other ICs on the node. The voltages are applied to the inputs of synchronous detector 318, to provide a square wave output at frequency f2, wherein the magnitudes of the positive and negative swings of the square wave represent the voltages due to the test current components flowing into and away from R1. The output of detector 318 is then synchronously detected by detector 320 to provide dc output 322 whose magnitude represents the ratio R1/R2 and whose sign indicates which is the larger, e.g., a positive output indicating R1 is greater than R2 and a negative output indicating R1 is less than R2. The embodiment shown in FIG. 11 thereby determines the ratio R1/R2 in one combined measurement step, wherein the measurements are made across a single segment of lead 310, and without having to know the value of resistance 303.

In the embodiment of FIG. 12, probe 400 is placed against the lead of the IC with the cantilever springs of the probe tips allowing tips 404 and 406 to contact the straight portion of the lead and tip 402 to go around the bend on the lead. (In some ICs, the straight portion of the lead may be long enough to accommodate all three tips. But, unlike the case for the embodiments of FIGS. 1-10, in this embodiment the inequality in lead segment length resulting from having the lead bend in one segment while the other segment is straight does not affect test accuracy because only orders of magnitude, not specific values, are being measured.) Tip 406 is selected as an injection tip and connected, through switch 414, to source 412, and a 200 ma dc test current is injected into the lead. The voltage appearing between tips 402 and 404 due to test current flowing into the internal resistance of the IC is applied to measurement circuitry 424 through relay 420 and transformer 422, with the relay alternately reversing the polarity of this voltage at the input to the transformer, so that the voltage at the transformer input appears as a square wave signal. Measuring circuitry 424 takes a measurement during each half-cycle of this square wave (thus cancelling any internal offset in the measuring circuitry), and generates output 432 to provide a general indication of the current flowing into the IC. The presence of a substantial current flow where none was expected would indicate a short (i.e., too low an internal resistance) in the IC. Alternately, tip 402 can be selected as the injection tip and tips 404 and 406 as the measuring tips to provide a general indication of whether there is a short on the side of the probe away from the IC.

The placement of the probe tips is monitored, during alternate half cycles, by injecting a pulse from generator 426 into the measurement tips at the start of the half cycles; if the measurement tips are effectively shorted together through the lead, the pulse is reflected and detector 428 detects the reflected pulse to provide an indication that the tips are making proper contact.

The two measuring tips and measuring circuitry 416 may be used alone to gain useful information relating to the condition of IC 410 by applying operating voltages to the circuit board and exercising the IC (i.e., by applying changing input signals to cause a change in the output at lead 408). The change in voltage between the measuring tips due to the change in the normal operating current flowing in lead 408 can be compared to that known to appear if IC 410 is not faulty.

If the probe of FIG. 13 is used, any injected test current must go through tip 506, which is too close to tip 504 to serve as a measuring tip.

The particular diagnostic system illustrated in FIG. 10, including the comparisons of $R_1$ with $R_2$ and K, and the testing of $R_1/R_2$ against selected limits, was the sole invention of Joseph Wrinn, as was the use of a wide band amplifier followed by a narrow band filter between the transformer and the synchronous detector. Certain aspects of the signal processing circuitry, including the twisted wires connected to the probe and the coaxial winding on the transformer, were the sole invention of Mark Hoffman.

Other embodiments are within the following claims. E.g., contact springs 208, 210, and 212 of the probe might preferably be made from wire having a square cross-section, with the contact tips formed at a corner of the cross-section rather than by a curved edge as appears in the present embodiment, possibly further reducing the rate at which tip contact area increases with wear, and providing a sharper tip to dig into the lead.

Further by way of example, in connection with the three stage diagnostic procedure, useful information can be obtained by carrying out stage three directly after determining whether an active drive is present, and even by omitting the ratio comparison branch of stage three, although such a procedure yields a less reliable diagnosis.

We claim:

1. In apparatus for analyzing electrical circuit boards by measuring the voltage drops due to test currents flowing in opposite directions along the straight portion of the conductive lead of an integrated circuit element mounted on a board, that improvement comprising
   a probe having at least three contact tips mounted to simultaneously contact three equally spaced points on said lead, said points being spaced apart sufficiently to permit measurement of electrical activity in each of the lead segments between adjacent pairs of said tips,
   means for injecting an ac test signal through the tip nearest said element and for measuring the voltage drop between the two tips farthest therefrom due to test current flowing through one said lead segment, and
   means for injecting a test signal through the tip farthest from said element and for measuring the voltage drop between the two tips nearest thereto due to test current flowing through the other said lead segment,
   said means for measuring being sensitive enough to detect voltage differences as small as 10 microvolts.

2. In apparatus for analyzing electrical circuit boards, comprising a probe having a least two contact tips close enough to each other to simultaneously contact a conductor to an integrated circuit element mounted on said board, wherein said tips are spaced apart from each other sufficiently to permit measurement of the voltage drop therebetween resulting from the flow of test current through the resistance of the conductor segment between the tips, and wherein measurements are made of voltage drops due to test currents flowing in opposite directions through said conductor to determine the ratio $R_1/R_2$, where $R_1$ is the internal resistance of said integrated circuit element and $R_2$ is the combined parallel resistance of other integrated circuit elements connected to the same node on said board, that improvement comprising means for injecting a test signal into said conductor through a said probe and making at least one voltage measurement at a said tip to determine the combined parallel resistance $R_t$ of all said integrated circuit elements connected to said node, whereby the absolute values of $R_1$ and $R_2$ may be determined from $R_t$ and said ratio.

3. The improvement of claim 2 wherein said test signal is dc.

4. The improvement of claim 2 wherein said means comprises means for measuring the difference between the voltages at said tip with and without injection of said test signal.

5. The improvement of claim 2 wherein said test signal is injected through said tip at which said one voltage measurement is made.

6. The improvement of claim 2 wherein said test signal injecting means comprises means for injecting test signals in the below 10 ma range, and said means for measuring comprises means for measuring voltages in the microvolt range, whereby said circuit boards can be tested while powered up without affecting their normal operation, so as to expose faults not otherwise easily detected.

7. The improvement of claim 6 wherein said injecting means comprises means for injecting ac test signals, and said measuring means comprises a synchronous detector coupled to said probe through a transformer.

8. The improvement of claim 6 wherein said means for injecting comprises means for injecting test signals as low as 0.1 ma.

9. The improvement of claim 6 wherein said means for measuring comprises means for measuring voltages in the nanovolt range.

10. The improvement of claim 7 wherein said ac test signals are in the KHz frequency range.

11. The improvement of claim 6 wherein said conductor is a lead of said element.

12. The improvement of claim 6 wherein said tips span a total distance of no more than 0.08 inch.

13. In apparatus for analyzing electrical circuit boards, comprising a probe having at least two contact tips close enough to each other to simultaneously contact a lead of an integrated circuit element mounted on said board, wherein said tips are spaced apart from each other sufficiently to permit measurement of the voltage drop therebetween resulting from the flow of test current through the resistance of the lead segment between the tips, that improvement comprising means operative during said measurement for monitoring the electrical contact between said tips and said conductor by comparing electrical outputs of said tips, and means for indicating whether said comparison is as expected.

14. The improvement of claim 13 wherein means are provided for injecting into said tips 180° phase shifted versions of an ac signal differing sufficiently in frequency from said test signal so as not to interfere therewith, and said means for monitoring by comparing comprises means for indicating whether said ac signal versions have cancelled each other in the output of said probe.

15. The improvement of claim 14 wherein said test signal is ac and said first mentioned ac signal is of frequency an order of magnitude greater than that of said test signal.

16. The improvement of claim 14 wherein said test signal is ac and means for measuring said voltage drop comprises frequency discriminating means for selectively passing said test signal frequency.

17. The improvement of any of claims 1–5 or 13–16 wherein each said tip has a single contact member.

18. The improvement of any of claims 1–5 or 14–16 wherein said tips span a total distance of no greater than 0.08 inch.

19. The apparatus of any of claims 1–5 or 13–16 further comprising means operative during said measurement for monitoring the electrical contacts between said conductor and said injection tip and between said conductor and one of said measuring tips by comparing electrical outputs of said tips, and means for indicating whether said comparison is exceeded.

20. The apparatus of claim 19 wherein said measuring tip is that adjacent to said injection tip.

21. The apparatus of any of claims 1–5 or 13–16 further comprising means operative during said measurement for monitoring the electrical contact between said conductor and two of said contact tips, said monitoring means comprising means for injecting into said two tips 180° phase shifted versions of an ac signal differing sufficiently in frequency from said test signal so as not to interfere therewith, and means for indicating whether said ac signal versions have cancelled each other in the output of said probe.

22. The monitoring means of claim 21 wherein said two tips are said measuring tips.

23. The improvement of claim 21 wherein said test signal is ac and said 180° phase shifted ac signals are of frequency an order of magnitude greater than that of said test signal.

24. The improvement of claim 21 wherein said test signal is ac and means for measuring said voltage drop comprises frequency discriminating means for selectively passing said test signal frequency.

25. The improvement of any of claims 1–5 or 13–16 further comprising first and second means operative during said measurements for monitoring the electrical contacts between said tips and said conductor, said first means comprising means for monitoring the electrical contacts between said conductor and said injection tip and between said conductor and one of said measuring tips by comparing electrical outputs of said tips, and means for indicating whether said comparison is exceeded, and said second means comprising means for monitoring the electrical contact between said conductor and two of said contact tips, said monitoring means comprising means for injecting into said two tips 180° phase shifted versions of an ac signal differing sufficiently in frequency from said test signal so as not to interfere therewith, and means for indicating whether said ac signal versions have cancelled each other in the output of said probe.

* * * * *

UNITED STATES PATENT AND TRADEMARK OFFICE
CERTIFICATE OF CORRECTION

PATENT NO. : 4,178,543
DATED : December 11, 1979
INVENTOR(S) : Joseph F. Wrinn et al.

It is certified that error appears in the above-identified patent and that said Letters Patent are hereby corrected as shown below:

Column 3, line 51, "Torsion springs 40 and 42" begins a new paragraph.

Column 6, line 11, "Each tip in a rigid needle," is changed to --Each tip is a rigid needle,--.

Column 8, line 55, "Vx ≃ I1 x R1 ≃ I12 x R2" is changed to --Vx ≃ I1 x R1 ≃ I2 x R2--.

Column 9, line 41, "connected to the anode" is changed to --connected to the node--.

Column 12, line 12, "if, however," is changed to --If, however,--.

Column 13, line 43, "half-cycle" is changed to --half cycle--.

Column 14, claim 2, line 56, "having a least" is changed to --having at least--.

Signed and Sealed this

Thirteenth Day of May 1980

[SEAL]

Attest:

SIDNEY A. DIAMOND

Attesting Officer      Commissioner of Patents and Trademarks